(12) United States Patent
Bandyopadhyay

(10) Patent No.: US 9,698,805 B1
(45) Date of Patent: Jul. 4, 2017

(54) ELECTRICAL NOISE REDUCTION IN AN ANALOG-TO-DIGITAL CONVERTER

(71) Applicant: Analog Devices, Inc., Norwood, MA (US)

(72) Inventor: Abhishek Bandyopadhyay, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/261,643

(22) Filed: Sep. 9, 2016

(51) Int. Cl.
*H03M 1/38* (2006.01)
*H03M 1/06* (2006.01)
*H03M 1/46* (2006.01)
*H03M 1/12* (2006.01)

(52) U.S. Cl.
CPC ......... *H03M 1/0626* (2013.01); *H03M 1/124* (2013.01); *H03M 1/466* (2013.01)

(58) Field of Classification Search
CPC .... H03M 1/0626; H03M 1/466; H03M 1/124; H03M 1/66; H03M 1/38; H03M 1/48; H03M 1/06; H03M 1/10
USPC ........................................ 341/155, 161, 120
See application file for complete search history.

(56) References Cited

U.S. PATENT DOCUMENTS 9,197,240 B1* 11/2015 Kinyua ................. H03M 1/002
2007/0252747 A1* 11/2007 Lyden ................. H03M 1/0641
341/161

OTHER PUBLICATIONS

Chen, Zhijie, et al., "A 9.35-ENOB, 14.8 fJ/conv._step Fully-Passive Noise-Shaping SAR ADC", 2015 Symposium on VLSI Circuits Digest of Technical Papers, (2015), C64-C65.
Fredenburg, Jeffrey A., et al., "A 90-MS/s 11-MHz-Bandwidth 62-dB SNDR Noise-Shaping SAR ADC", IEEE Journal of Solid-State Circuits, vol. 47, No. 12, (Dec. 2012), 2898-2904.
Song, Bang-Sup, "A Fourth-Order Bandpass Delta-Sigma Modulator with Reduced Number of Op Amps", IEEE Journal of Solid-State Circuits, vol. 30, No. 12, (Dec. 1995), 1309-1315.

* cited by examiner

*Primary Examiner* — Jean B Jeanglaude
(74) *Attorney, Agent, or Firm* — Schwegman Lundberg & Woessner, P.A.

(57) ABSTRACT

A system and method can be provided for sampling the residual error in an oversampled SAR ADC, bandpass filtering the sampled residual error, and providing the bandpass filtered signal to an input of a DAC, such as to provide a bandpass filtered output of the SAR ADC. The bandpass filtered output of the SAR ADC can have a reduced electrical noise.

20 Claims, 10 Drawing Sheets

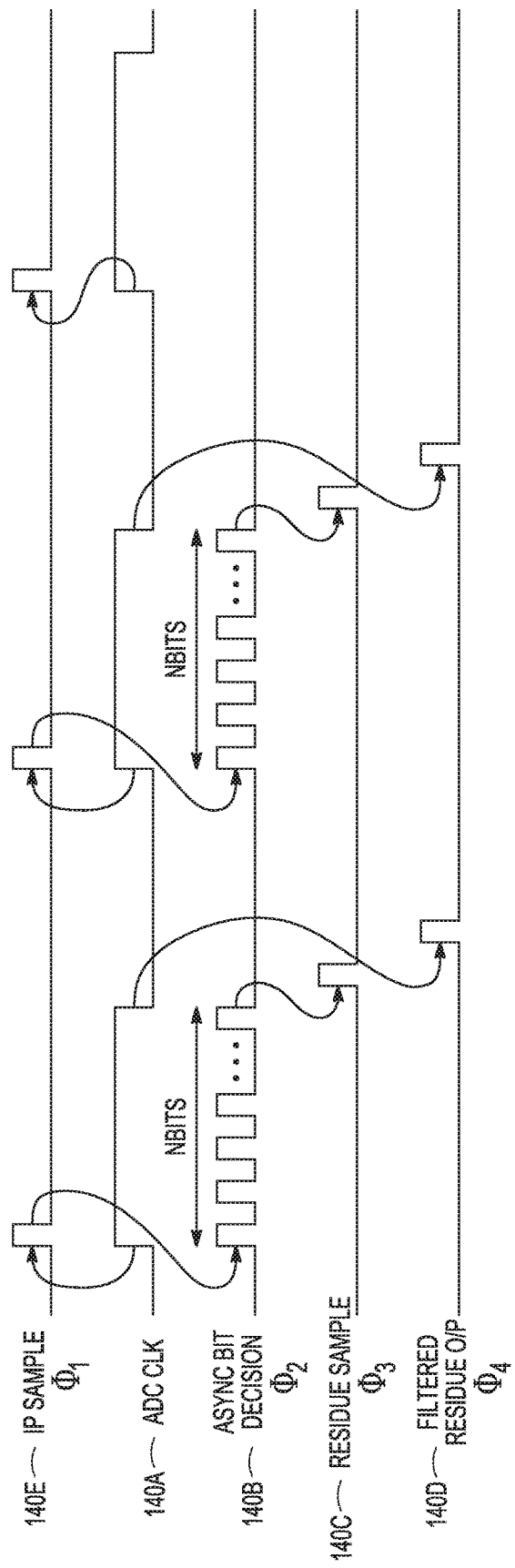

ELECTRICAL NOISE REDUCTION IN AN ANALOG-TO-DIGITAL CONVERTER

FIELD OF THE DISCLOSURE

The present disclosure relates to systems and methods for filtering electronic noise in a successive approximation register (SAR) analog-to-digital converter (ADC).

BACKGROUND

Certain successive approximation register (SAR) analog-to-digital converters (ADCs) include digital filters, such as bandpass filters at an output to improve performance of the SAR ADC.

SUMMARY OF THE DISCLOSURE

In certain systems, a bandpass converter can include an active filter such as that including an operational amplifier. In a low voltage bandpass converter, an active filter including an operational amplifier may be impractical because of reduced headroom and increased power consumption at low voltages. Additionally, bandpass converters including operational amplifiers in a low voltage system may suffer from undesirable process variations during manufacture. The inventors have recognized, among other things, that it is possible to provide a bandpass SAR ADC converter, such as by oversampling and filtering a residual error in a SAR ADC following an N-bit digital conversion of an analog input signal. The sampled and filtered residual error can be provided during the next N-bit digital conversion, such as to provide a bandpass shaped SAR ADC.

In an aspect, the disclosure can feature a method of bandpass shaping the noise of a sequential approximation register (SAR) analog-to-digital converter (ADC) circuit having a comparator, a digital-to-analog converter (DAC) circuit, and logic circuitry.

The method can include sampling an analog input signal by the DAC circuit and carrying out at least one bit trial of the DAC in cooperation with the comparator and logic circuitry, such as to convert the sampled analog input signal into a digital signal and thereby leave the DAC in a bit-trialed state. The method can also include sampling a residual error of the DAC while in the bit-trialed state. The method can also include filtering the sampled residual error with a bandpass filter. The method can also include providing the output signal of the bandpass filter as a feedback signal.

The method can also include adding the output signal of the bandpass filter as a feedback signal to the DAC. The method can also include subtracting the output signal of the bandpass filter from a reference voltage provided by the DAC. The bandpass filter can a passive filter configured to sample the residual error of the DAC while in the bit-trialed state. The bandpass filter can be a switched capacitor filter configured to store charge on at least one capacitive element during bit trial cycles of the DAC circuit and transfer charge to or from the at least one capacitive element while the DAC is in the bit-trialed state. The method can also include transferring a charge corresponding to the output signal onto a capacitive storage element while the DAC is in the bit-trialed state. The method can also include connecting a terminal of the capacitive storage element to the DAC or reference during bit trials of the DAC. Sampling the residual error of the DAC while in a bit-trialed state can include sampling the residual error during one bit trial cycle of the DAC circuit. The method can also include converting the sampled residual error to a digital signal, filtering the digital signal with a digital bandpass filter, converting the filtered digital signal to an analog signal, and providing the analog signal as a feedback signal. The method can also include delaying the providing of the output signal of the bandpass filter as a feedback signal by one or more clock cycles of the SAR ADC.

In an aspect, the disclosure can feature an oversampled sequential approximation register (SAR) analog-to-digital converter (ADC) circuit. The oversampled SAR ADC circuit can include a digital-to-analog converter (DAC) circuit configured to sample an analog input signal and carry out at least one bit trial in cooperation with a comparator and logic circuitry, such as to convert the sampled analog input signal into a digital signal and thereby leave the DAC in a bit-trialed state. The oversampled SAR ADC circuit can include can also include a bandpass filter configured to sample a residual error of the DAC while in the bit-trialed state and provide a filtered output signal as a feedback signal to the comparator. The bandpass filter can be configured to add the output signal as a feedback signal to the DAC or subtract the output signal of the bandpass filter from a reference voltage of the SAR ADC circuit. The bandpass filter order or coefficients can be programmable. The bandpass filter can be a passive filter configured to sample the residual error of the DAC while in the bit-trialed state. The bandpass filter can be a switched capacitor filter configured to store charge on capacitive elements during bit trial cycles of the DAC circuit and transfer charge to or from the capacitive elements while the DAC is in the bit-trialed state. The oversampled SAR ADC circuit can also include a capacitive storage element configured to receive and store a charge corresponding to the filtered output signal while the DAC is in the bit-trialed state. The capacitive storage element can be configured to provide a voltage corresponding to the stored charge to the DAC during bit trials of the DAC. The bandpass filter can be configured to sample the residual error during one bit trial cycle of the DAC circuit. The oversampled SAR ADC circuit can also include an ADC circuit configured to convert the sampled residual error to a digital signal, a bandpass filter configured to filter the digital signal, and a digital-to-analog converter (DAC) configured to convert the filtered digital signal to an analog signal and provide the analog signal as a feedback signal.

In an aspect, the disclosure can feature an oversampled sequential approximation register (SAR) analog-to-digital converter (ADC) circuit. The oversampled SAR ADC circuit can include a means for sampling an analog input signal and carrying out at least one bit trial in cooperation with a comparator and logic circuitry to convert the sampled analog input signal into a digital signal and thereby leave the sampling means in a bit-trialed state. The means for sampling an analog input signal can include DAC 105, such as that shown in FIG. 1. The oversampled SAR ADC circuit can also include a means for sampling a residual error while the sampling means is in the bit-trialed state. The means for sampling a residual error can include the bandpass filter 125 and the summation circuit 120, such as that shown in FIG. 1. The oversampled SAR ADC circuit can also include a means for filtering the sampled residual error. The means for filtering can include the bandpass filter 125 and the delay line 130, such as that shown in FIG. 1. The oversampled SAR ADC circuit can also include a means for providing the output signal of the filtering means as a feedback signal. The means for providing the output signal can include the bandpass filter 125, delay line 130, and summation circuit 135, such as that shown in FIG. 1

Further features of the disclosure are provided in the appended claims, which features may optionally be combined with each other in any permutation or combination, unless expressly indicated otherwise elsewhere in this document.

BRIEF DESCRIPTION OF THE DRAWINGS

The present disclosure will now be described, by way of example, with reference to the accompanying drawings, in which:

FIG. 1C illustrates a timing diagram of a SAR ADC and bandpass shaping circuitry.

DETAILED DESCRIPTION OF EMBODIMENTS OF THE DISCLOSURE

A SAR ADC can convert an analog voltage, such as to provide an N-bit digital output. The N-bit digital output can be an approximation of the analog voltage, and a residual error can be present within the SAR ADC following a conversion (e.g., the residual error can be present at the plates of a capacitor DAC within the SAR ADC). The residual error can represent a quantization error associated with the imperfections in the analog-to-digital conversion. The quantization error and thermal noise, such as due to capacitors or resistors within the DAC can be the two principal noise sources within the SAR ADC. The inventors have recognized, among other things, that it is possible to provide bandpass filtering of the residual error to provide improved noise performance of the SAR ADC by reducing the electrical noise at the output of the SAR ADC such as due to quantization error.

Figure 1A:
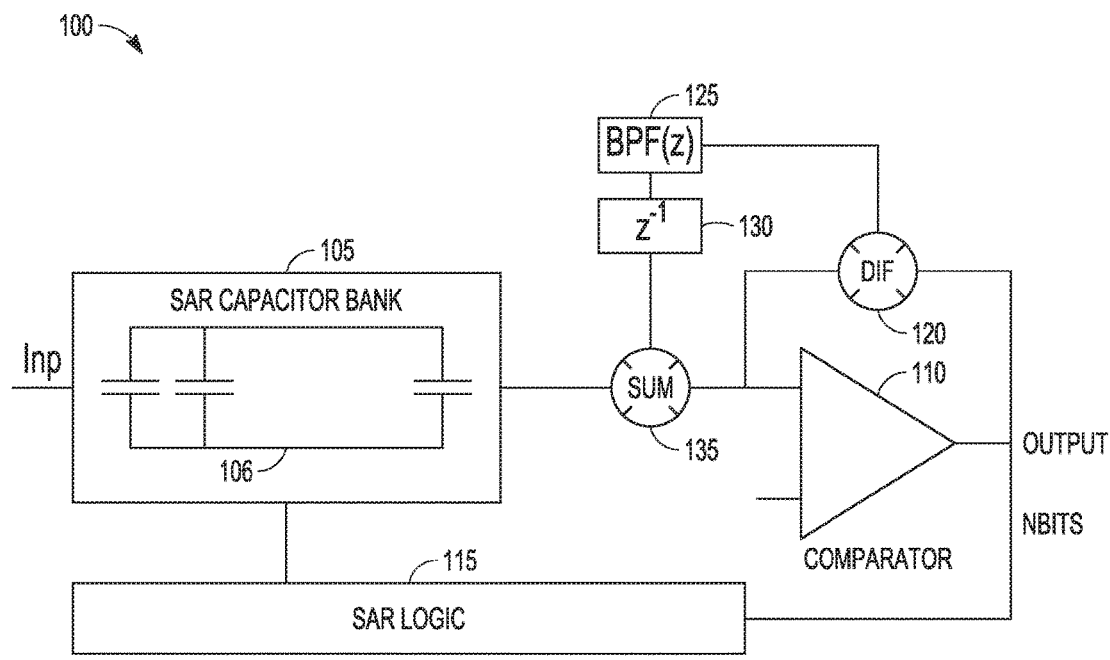
FIG. 1A illustrates a diagram of a SAR ADC and bandpass shaping circuitry.

FIG. 1A shows an example of a SAR ADC and bandpass shaping circuitry 100. The SAR ADC and bandpass shaping circuitry can include a digital-to-analog converter (DAC) 105, a summation circuit 135, a comparator 110, SAR logic circuitry 115, a summation circuit 120, a bandpass filter 125, and a delay line 130. In an example, the DAC 105 can be a capacitor DAC (CDAC) and can include an array of capacitors 106. The DAC 105 can be connected to the summation circuit 135 and to the SAR logic 115. The summation circuit 135 can be connected to the comparator 110 and to the delay line 130. The comparator 110 can be connected to the summation circuit 120 and to the SAR logic 115. The summation circuit 120 can be connected to the bandpass filter 125. The bandpass filter 125 can be connected to the delay line 130. During operation, an analog input signal can be sampled at an input of the DAC 105. The SAR logic circuitry 115 can control the operation of the DAC 105 and in cooperation with the comparator 110 can provide an N-bit digital estimation of the analog input signal having N-bits. The digital estimation can be provided such as by comparing the sampled analog input signal to reference voltages, such as those provided by the DAC 105 in series of N bit trials. In an example, each of the N bit trials can correspond to one clock cycle of a clock signal, such as a clock signal provided by the SAR logic circuitry 115. The comparator 110 can make a comparison during each of the N bit trials such as to provide results of the comparisons to the SAR logic circuitry 115. Following the N bit trials, the DAC 105 can be in a bit-trialed state. After conversion of the sampled analog input signal to an N-bit digital value, a residual error provided by the DAC 105 can represent a difference between the sampled analog input signal and the N-bit digital estimate. In an example, after N bit trials of the DAC 105, the SAR logic circuitry 115 can configure the DAC 105 for an additional bit trial (i.e., one bit trial cycle) to provide the residual error. In an example the DAC 105 can be a capacitor DAC (CDAC) and the residual error can be present at the plates of the array of capacitors 106. The residual error present at the plates of the array of capacitors 106 can be provided to the summation circuit 120 and the summation circuit 120 can provide a difference between the residual error and an output of the comparator 110 to an input of the bandpass filter 125. The bandpass filter 125 can provide a bandpass filtered output to a delay line 130. In an example, the bandpass filter 125 can be programmable, such as to allow the parameters of the transfer function associated with the bandpass filter 125 to be configured by an external controller. In an example, the bandpass filter 125 can be a passive filter, such as to be compatible with a low voltage SAR ADC (e.g., a SAR ADC having an operating voltage of less than or equal to 1 V). In an example, the bandpass filter 125 can be a switched capacitor filter. In an example, the bandpass filter 125 can be an infinite impulse response (IIR) filter. In an example, the bandpass filter 125 can be a finite impulse response (FIR) filter. The delay line 130 can provide the bandpass filtered output to a summation circuit 135, such as which can provide the bandpass filtered output to an input of the comparator 110 during the next N-bit digital conversion, such as to reduce the noise associated with the quantization error, the noise associated with the comparator 110, or thermal noise at the output of the comparator 110. The thermal noise, such as that associated with the array of capacitors 106 can be expressed as kBT/C where kB can represent Boltzmann's Constant $1.38\times10^{-23}$ J/K, T can represent temperature in Kelvin, and C can represent the capacitance of the array of capacitors 106. In an example, the SAR ADC can be a differential SAR or a single ended SAR. In an example, the electrical noise, such as that due to quantization error can be inversely proportional to the quality of the comparator 110 (e.g., a low quality comparator can have a larger electrical noise contribution than a high quality comparator). In the example, the electrical noise, such as that associated with a low quality comparator can be reduced at the output of comparator 110 in a system, such as that shown in FIG. 1A where the residual error can be filtered by the bandpass filter 125 and provided as a feedback signal to an input of the comparator 110.

Figure 1B:
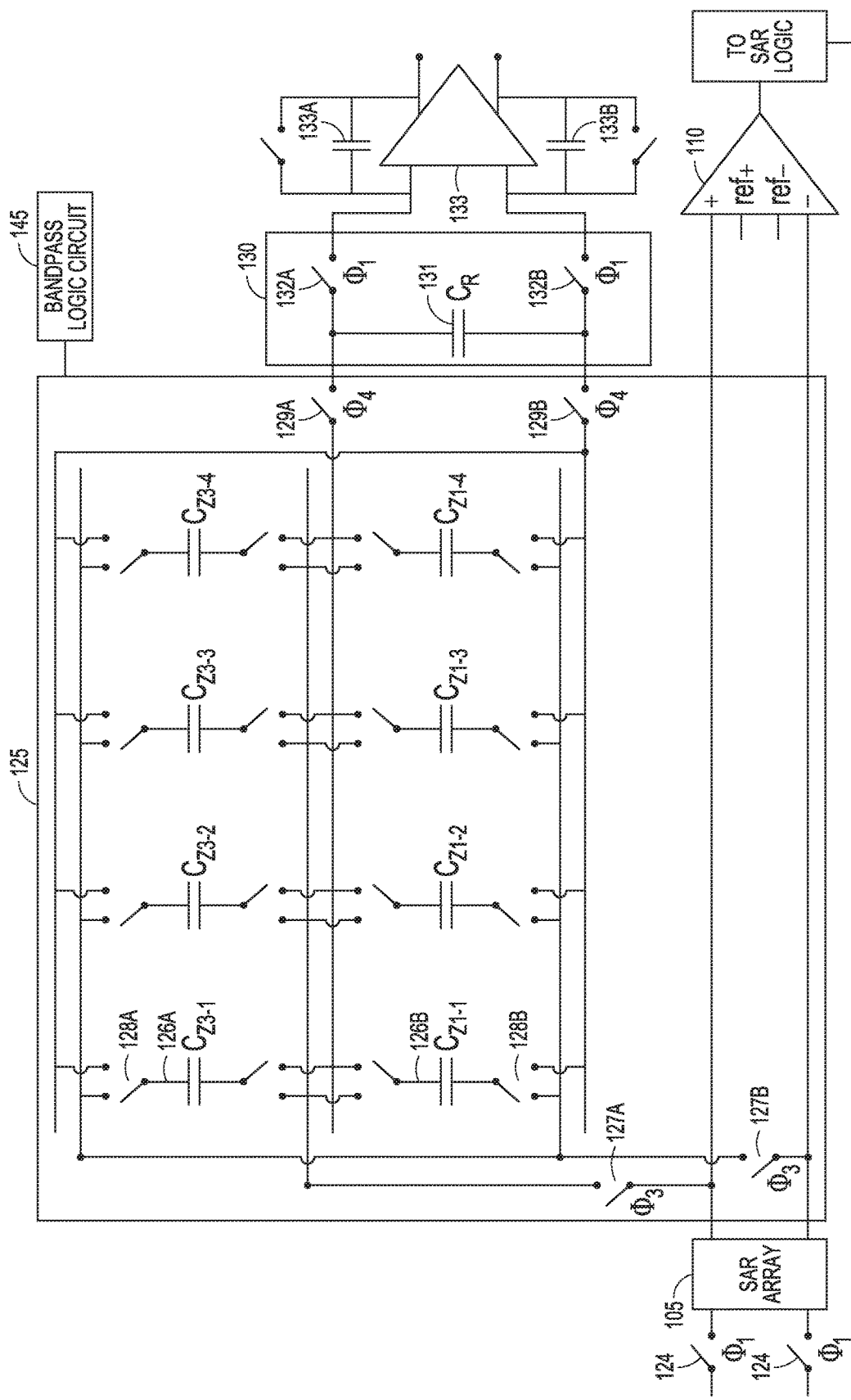
FIG. 1B illustrates a diagram of a SAR ADC and bandpass shaping circuitry.

FIG. 1B shows an example of a SAR ADC and bandpass shaping circuitry 100. The SAR ADC and bandpass shaping circuitry 100 can include a DAC 105, sampling switches 124, a bandpass filter 125, a delay line 130, an amplifier 133, feedback circuitry 133a, 133b, and bandpass logic circuitry 145. In the example, the bandpass filter 125 can include capacitive elements 126a, 126b, sampling switches 127a, 127b, switches 128a, 128b, and output switches 129a, 129b. The delay line 130 can include a storage capacitor 131 and switches 132a, 132b. The capacitive elements 126a, 126b can be connected to the switches 127, 128, and 129. The storage capacitor 131 can be connected to the switches 129 and 132. The switches 132a and 132b can provide a connection from the storage capacitor 131 to inputs of the amplifier 133. The bandpass logic circuitry 145 can be connected to the bandpass filter 125. During operation, the switches 127, 128, 129, and 132 can be operated to provide a fourth order bandpass filter having a transfer function of $2z^{-2}+z^{-4}$. The bandpass logic circuitry 145 can be configured to control the switching operation of switches 127, 128, 129, and 132. For example, the switches 127, 128, 129, and 132 can be operated according to the timing diagram shown in FIG. 1C. In the example, the switches 124 can be closed, such as to connect an analog input voltage to the DAC 105. The DAC 105, in cooperation with SAR logic circuitry 115 can sample and convert the analog input voltage into an N-bit digital value. After conversion of the analog input voltage to an N-bit digital value, the sampling switches 127 and switches 128 can be closed such as to sample a residual error present at the DAC 105 onto the capacitive elements 126. The capacitive elements 126 can store a charge corresponding to the sampled residual error. The switches 129 can be closed to connect the capacitive elements 126 to the storage capacitor 131, such as to transfer the stored charge to the storage capacitor 131. The switches 124 can then be opened to disconnect the analog input voltage and the switches 132 can be closed to provide a voltage corresponding to the stored charge to the input terminals of the amplifier 133. The amplifier can amplify the received voltage, such as to add the amplified voltage to a voltage sampled by the DAC 105. In an example, the amplified voltage can be subtracted from a reference voltage, such as a reference voltage provided by the DAC 105. In an example, the switches 132 can then be closed, such as to add the voltage corresponding to the stored charge to the plates of the DAC 105. In an example, the switches 132 can be closed, such as to subtract the voltage corresponding to the stored charge from a reference voltage.

In an example, the residual error can be sampled onto the capacitive elements 126 sequentially, such as to provide the fourth order bandpass filter having a transfer function of $2z^{-2}+z^{-4}$. In the example, each of the capacitive elements 126a and 126b can have the same value of capacitance. In the example the storage capacitor 131 can provide a voltage corresponding to charge previously stored on capacitive elements $C_{Z1-1}$, $C_{Z1-2}$, and $C_{Z3-1}$ to an input terminal of the amplifier 133, such as by closing switches 132. The amplifier 133 can amplify the voltage provided by the storage capacitor 131 and an output of the amplifier 133 can be provided to an input of the comparator 110, such as to add the amplified voltage to the plates of the DAC during a conversion of an analog input voltage to an N-bit digital value. After converting the analog input to an N-bit digital value, a residual error can then be sampled onto capacitive elements $C_{Z1-1}$, $C_{Z1-2}$, and $C_{Z3-1}$, such as by closing switches 127 and 128, and a charge previously stored on capacitive elements $C_{Z1-3}$, $C_{Z1-4}$, and $C_{Z3-2}$ can then be transferred to the storage capacitor 131, such as by closing switches 128 and 129. In the example the storage capacitor 131 can provide a voltage corresponding to charge previously stored on capacitive elements $C_{Z1-3}$, $C_{Z1-4}$, and $C_{Z3-2}$ to an input terminal of the amplifier 133, such as by closing switches 132. The amplifier 133 can amplify the voltage provided by the storage capacitor 131 and an output of the amplifier 133 can be provided to an input of the comparator 110, such as to add the amplified voltage to the plates of the DAC during a conversion of an analog input voltage to an N-bit digital value. After converting the analog input to an N-bit digital value, a residual error can then be sampled onto capacitive elements $C_{Z1-3}$, $C_{Z1-4}$, and $C_{Z3-2}$, such as by closing switches 127 and 128, and a charge previously stored on capacitive elements $C_{Z1-1}$, $C_{Z1-2}$, and $C_{Z3-3}$ can then be transferred to the storage capacitor 131, such as by closing switches 128 and 129. In the example the storage capacitor 131 can provide a voltage corresponding to charge previously stored on capacitive elements $C_{Z1-1}$, $C_{Z1-2}$, and $C_{Z3-3}$ to an input terminal of the amplifier 133, such as by closing switches 132. The amplifier 133 can amplify the voltage provided by the storage capacitor 131 and an output of the amplifier 133 can be provided to an input of the comparator 110, such as to add the amplified voltage to the plates of the DAC during a conversion of an analog input voltage to an N-bit digital value. After converting the analog input to an N-bit digital value, a residual error can then be sampled onto capacitive elements $C_{ZL-1}$, $C_{Z1-2}$, and $C_{Z3-3}$, such as by closing switches 127 and 128, and a charge previously stored on capacitive elements $C_{Z1-3}$, $C_{Z1-4}$, and $C_{Z3-4}$ can then be transferred to the storage capacitor 131, such as by closing switches 128 and 129. In the example the storage capacitor 131 can provide a voltage corresponding to charge previously stored on capacitive elements $C_{Z1-3}$, $C_{Z1-3}$, and $C_{Z3-4}$ to an input terminal of the amplifier 133, such as by closing switches 132. The amplifier 133 can amplify the voltage provided by the storage capacitor 131 and an output of the amplifier 133 can be provided to an input of the comparator 110, such as to add the amplified voltage to the plates of the DAC during a conversion of an analog input voltage to an N-bit digital value. After converting the analog input to an N-bit digital value, a residual error can then be sampled onto capacitive elements $C_{Z1-3}$, $C_{Z1-4}$, and $C_{Z3-4}$, such as by closing switches 127 and 128, and a charge previously stored on capacitive elements $C_{Z1-1}$, $C_{Z1-2}$, and $C_{Z3-1}$ can then be transferred to the storage capacitor 131, such as by closing switches 128 and 129.

In the example, the sampling of the residual error can continue in the above described pattern to realize a $4^{th}$ order bandpass filter having a transfer function of $2z^{-2}+z^{-4}$, where the bandpass filter 125 has a transfer function of $2z^{-1}+z^{-3}$ and the delay line 130 has a transfer function of $z^{-1}$. In an example, the capacitive elements 126a, 126b can be shuffled such as to average out effects due to capacitor mismatch (e.g., after bandpass filter 125 has operated for a time interval, switches 128a and 128b can be reconfigured such that capacitive element $C_{Z1-3}$ can exchange positions with $C_{Z3-1}$). In an example, an output of the amplifier 133 can be provided to the comparator 110, such as to subtract the amplified voltage from a reference voltage during a conversion of an analog input voltage to an N-bit digital value. In an example, the amplifier 133 can be omitted from the SAR ADC and bandpass shaping circuitry 100 and the storage capacitor 131 can provide a stored voltage directly to an input of the comparator 110, such as by closing switches 132.

Figure 1D:
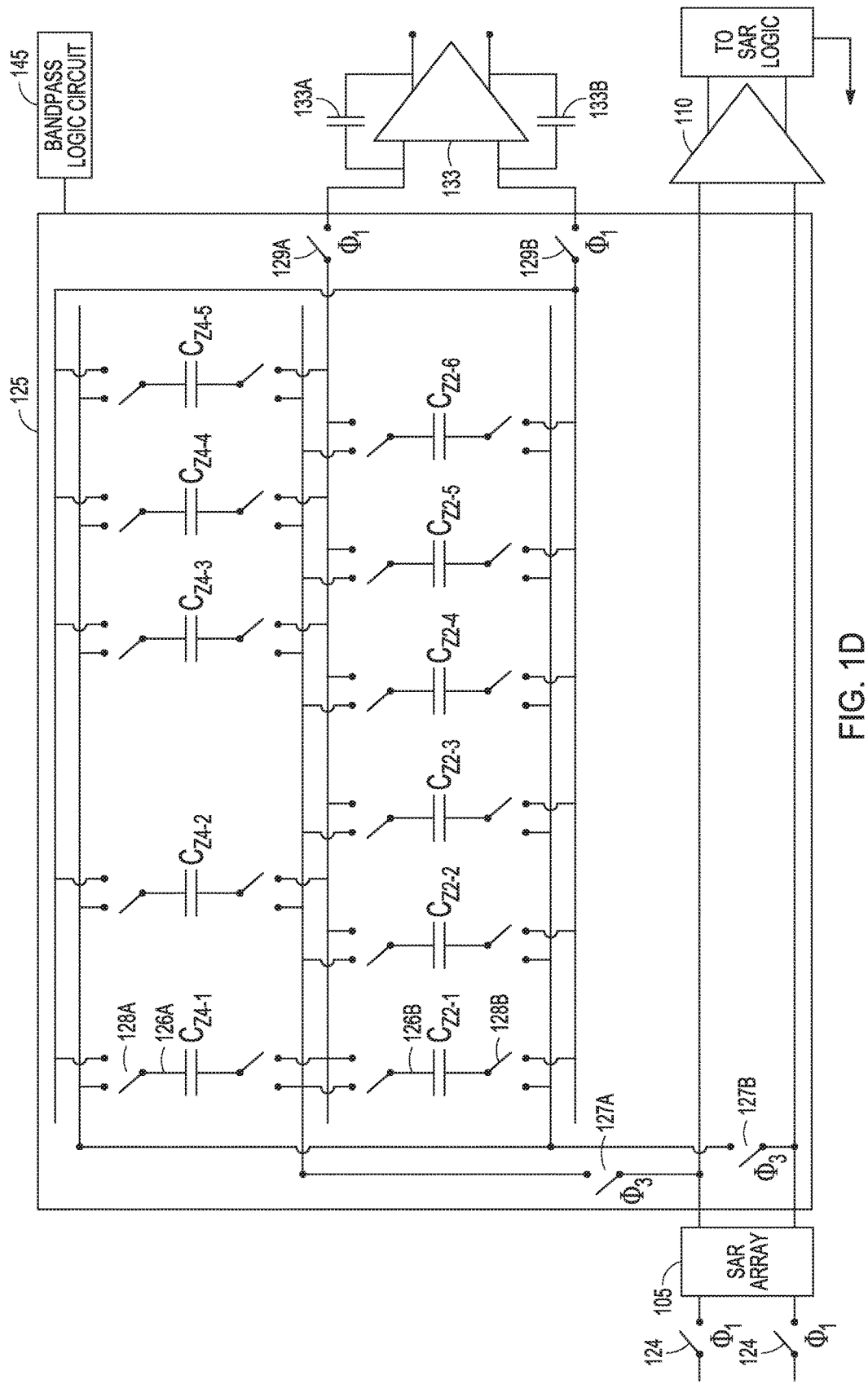
FIG. 1D illustrates a diagram of a SAR ADC and bandpass shaping circuitry.

FIG. 1C shows a timing diagram that can describe an example of operation of SAR ADC and bandpass shaping circuitry 100. The timing diagram can include a SAR ADC clock signal 140a, a sampling signal 140e ($\phi_1$), N bit trial cycles of the DAC 140b ($\phi_2$), one additional bit trial cycle that provides a residual error 140c ($\phi_3$), and providing the residual error to the DAC during bit trials 140d ($\phi_4$). In the example, an analog input signal can be sampled and converted to an N-bit digital output by the DAC 105, SAR logic circuitry 115, and comparator 110 while the ADC clock signal 140a corresponds to a digital high. The conversion can occur during N bit trial cycles 140b of the DAC. An additional bit trial cycle 140c can then be performed by the DAC 105 such as to provide a residual error. The residual error can be sampled and filtered and then provided to the DAC 105 during the next ADC clock cycle 140a. FIG. 1D shows an example of a SAR ADC and bandpass shaping circuitry 100. The SAR ADC and bandpass shaping circuitry 100 can include a DAC 105, sampling switches 124, a bandpass filter 125, an amplifier 133, feedback circuitry 133a, 133b, and bandpass logic circuitry 145. In the example, the bandpass filter 125 can include capacitive elements 126a, 126b, sampling switches 127a, 127b, switches 128a, 128b, and output switches 129a, 129b. The capacitive elements 126a, 126b can be connected to the switches 127, 128, and 129. The switches 129a and 129b can provide a connection from the capacitive elements 126a, 126b to the inputs of the amplifier 133. The bandpass logic circuitry 145 can be connected to the bandpass filter 125. During operation, the switches 127, 128, and 129 can be operated to provide a fourth order bandpass filter having a transfer function of $2z^{-2}+z^{-4}$. The bandpass logic circuitry 145 can be configured to control the switching operation of switches 127, 128, and 129. For example, the switches 127, 128, and 129 can be operated according to the timing diagram shown in FIG. 1D. In the example, the switches 124 can be closed, such as to connect an analog input voltage to the DAC 105. The DAC 105, in cooperation with SAR logic circuitry 115 can convert the analog input voltage into an N-bit digital value. After conversion of the analog input voltage to an N-bit digital value, the sampling switches 127 and switches 128 can be closed such as to sample a residual error present at the DAC 105 onto the capacitive elements 126. The capacitive elements 126 can store a charge corresponding to the sampled residual error. The switches 124 can then be opened to disconnect the analog input voltage and the switches 129 can be closed to provide a voltage corresponding to the stored charge to the input terminals of the amplifier 133. The amplifier can amplify the received voltage and provide an amplified voltage to the DAC 105. In an example, the DAC 105 can be a CDAC and the amplifier 133 can provide the received voltage to the plates of the CDAC. In an example, the amplified voltage can be subtracted from a reference voltage, such as a reference voltage provided by the DAC 105. In an example, switches 129 can be closed to add a voltage corresponding to the stored charge to the DAC 105, without the use of the amplifier 133. In an example, switches 129 can be closed to subtract a voltage corresponding to the stored charge from a reference voltage of the DAC 105, without the use of the amplifier 133. In an example, the residual error can be sampled onto the capacitive elements 126 sequentially, such as to provide the fourth order bandpass filter having a transfer function of $2z^{-2}+z^{-4}$. In the example, each of the capacitive elements 126a and 126b can have the same value of capacitance.

In the example a voltage corresponding to charge previously stored on capacitive elements $C_{Z2-1}$, $C_{Z2-2}$, and $C_{Z4-1}$ can be provided to an input terminal of the amplifier 133, such as by closing switches 129. The amplifier 133 can amplify the provided voltage and an output of the amplifier can be provided to an input of the comparator 110, such as to add the amplified voltage to an input of the DAC during a conversion of an analog input voltage to an N-bit digital value. After converting the analog input to an N-bit digital value, a residual error can then be sampled onto capacitive elements $C_{Z2-1}$, $C_{Z2-2}$, and $C_{Z4-1}$ and for the next ADC clock a charge previously stored on capacitive elements $C_{Z2-3}$, $C_{Z2-4}$, and $C_{Z4-2}$ can then be transferred to the inputs of the comparator 110, such as by closing switches 129. In the example a voltage corresponding to charge previously stored on capacitive elements $C_{Z2-3}$, $C_{Z2-4}$, and $C_{Z4-2}$ can be provided to an input terminal of the amplifier 133, such as by closing switches 129. The amplifier 133 can amplify the provided voltage and an output of the amplifier can be provided to an input of the comparator 110, such as to add the amplified voltage to an input of the DAC during a conversion of an analog input voltage to an N-bit digital value. After converting the analog input to an N-bit digital value, a residual error can then be sampled onto capacitive elements $C_{Z2-3}$, $C_{Z2-4}$, and $C_{Z4-2}$ and for the next ADC clock a charge previously stored on capacitive elements $C_{Z2-5}$, $C_{Z2-6}$, and $C_{Z4-3}$ can then be transferred to the inputs of the comparator 110, such as by closing switches 129. In the example a voltage corresponding to charge previously stored on capacitive elements $C_{Z2-5}$, $C_{Z2-6}$, and $C_{Z4-3}$ can be provided to an input terminal of the amplifier 133, such as by closing switches 129. The amplifier 133 can amplify the provided voltage and an output of the amplifier can be provided to an input of the comparator 110, such as to add the amplified voltage to an input of the DAC during a conversion of an analog input voltage to an N-bit digital value. After converting the analog input to an N-bit digital value, a residual error can then be sampled onto capacitive elements $C_{Z2-5}$, $C_{Z2-6}$, and $C_{Z4-3}$ and for the next ADC clock a charge previously stored on capacitive elements $C_{Z2-1}$, $C_{Z2-2}$, and $C_{Z4-4}$ can then be transferred to the inputs of the comparator 110, such as by closing switches 129. In the example a voltage corresponding to charge previously stored on capacitive elements $C_{Z2-1}$, $C_{Z2-2}$, and $C_{Z4-4}$ can be provided to an input terminal of the amplifier 133, such as by closing switches 129. The amplifier 133 can amplify the provided voltage and an output of the amplifier can be provided to an input of the comparator 110, such as to add the amplified voltage to an input of the DAC during a conversion of an analog input voltage to an N-bit digital value. After converting the analog input to an N-bit digital value, a residual error can then be sampled onto capacitive elements $C_{Z2-1}$, $C_{Z2-2}$, and $C_{Z4-5}$ and for the next ADC clock a charge previously stored on capacitive elements $C_{Z2-3}$, $C_{Z2-4}$, and $C_{Z4-5}$ can then be transferred to the inputs of the comparator 110, such as by closing switches 129. In the example a voltage corresponding to charge previously stored on capacitive elements $C_{Z2-3}$, $C_{Z2-4}$, and $C_{Z4-5}$ can be provided to an input terminal of the amplifier 133, such as by closing switches 129. The amplifier 133 can amplify the provided voltage and an output of the amplifier can be provided to an input of the comparator 110, such as to add the amplified voltage to an input of the DAC during a conversion of an analog input voltage to an N-bit digital value. After converting the analog input to an N-bit digital value, a residual error can then be sampled onto capacitive elements $C_{Z2-3}$, $C_{Z2-4}$, and $C_{Z4-5}$ and for the next ADC clock a charge previously stored on capacitive elements $C_{Z2-5}$, $C_{Z2-6}$, and $C_{Z4-1}$ can then be transferred to the inputs of the comparator 110, such as by closing switches 129. In the example, the sampling of the residual error can continue in the above described pattern to realize a $4^{th}$ order bandpass filter having a transfer function of $2z^{-2}+z^{-4}$, where the bandpass filter 125 has a transfer function of $2z^{-2}+z^{-4}$.

Figure 1E:
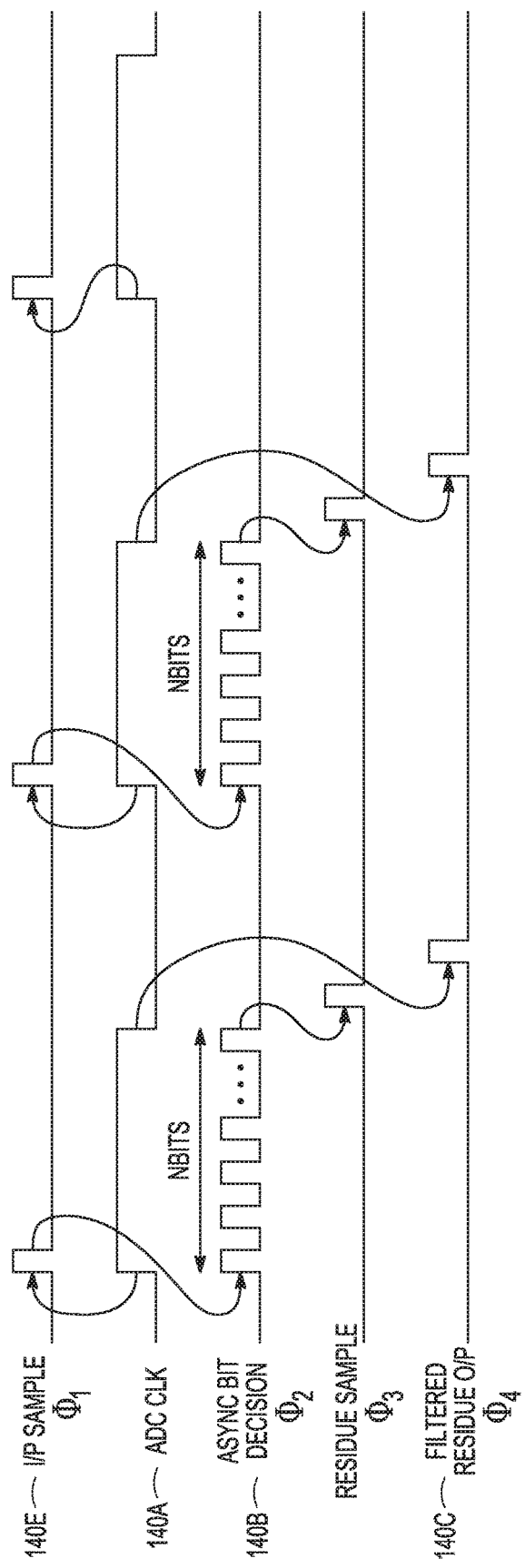
FIG. 1E illustrates a timing diagram of a SAR ADC and bandpass shaping circuitry.

FIG. 1E shows a timing diagram that can describe an example of operation of SAR ADC and bandpass shaping circuitry 100. The timing diagram can include a SAR ADC clock signal 140*a*, a sampling signal 140*e* ($\phi_1$), N bit trial cycles of the DAC 140*b* ($\phi_2$), and one additional bit trial cycle that provides a residual error 140*c* ($\phi_3$). In the example, an analog input signal can be converted to an N-bit digital output by the DAC 105, SAR logic circuitry 115, and comparator 110 while the ADC clock signal 140*a* corresponds to a digital high. The conversion can occur during N bit trial cycles 140*b* of the DAC. An additional bit trial cycle 140*c* can then be performed by the DAC 105 such as to provide a residual error. The residual error can be sampled and filtered and then provided to the DAC 105 during the next ADC clock cycle 140*a*.

Figure 2A:
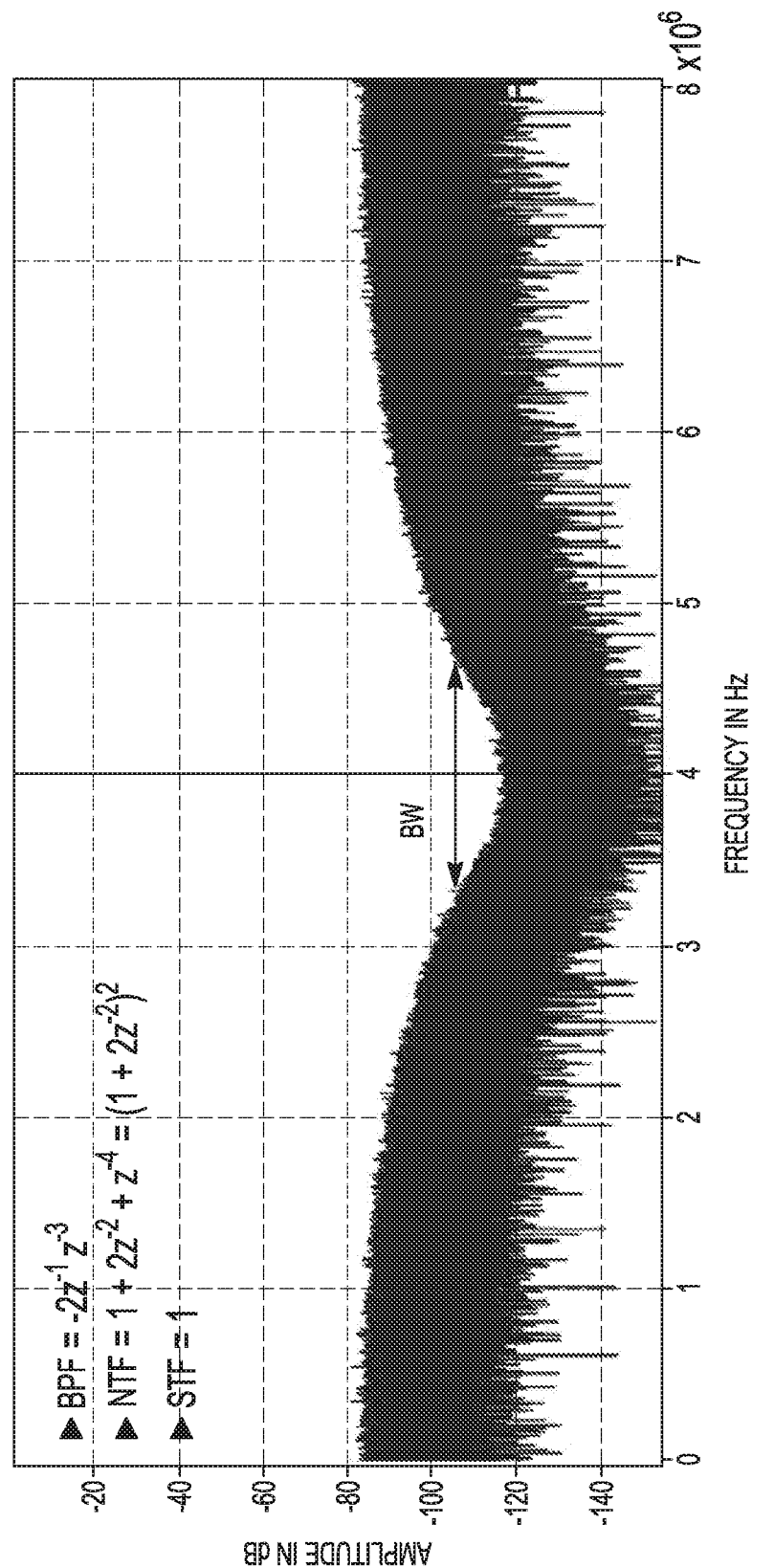
FIG. 2A illustrates an example of the output in a bandpass shaped SAR ADC.

FIG. 2A shows a simulated example of a noise transfer function in bandpass shaped SAR ADC, such as the SAR ADC and bandpass shaping circuitry 100. In the example shown in FIG. 2A, the DAC 105 can be a CDAC and the bandpass shaped SAR ADC can include 8 bits of quantization (e.g., the CDAC 105 can represent 8 digital bits), and the array of capacitors 106 can have a total capacitance of 1.5 pF. The bandpass filter can be a $4^{th}$ order passive filter. The noise transfer function can have a center frequency of 4 MHz and a bandwidth BW of 1 MHz. In the example, the noise transfer function can be $2z^{-2}+z^{-4}$. In an example, the bandpass filter can be implemented with capacitors and switches. The DAC 105 can sample an analog input signal at a rate of 16 MHz and the OSR (oversampling rate) can be 8. In the example, the signal-to-noise ratio of the bandpass shaped SAR ADC can be 80.59 dB.

Figure 2B:
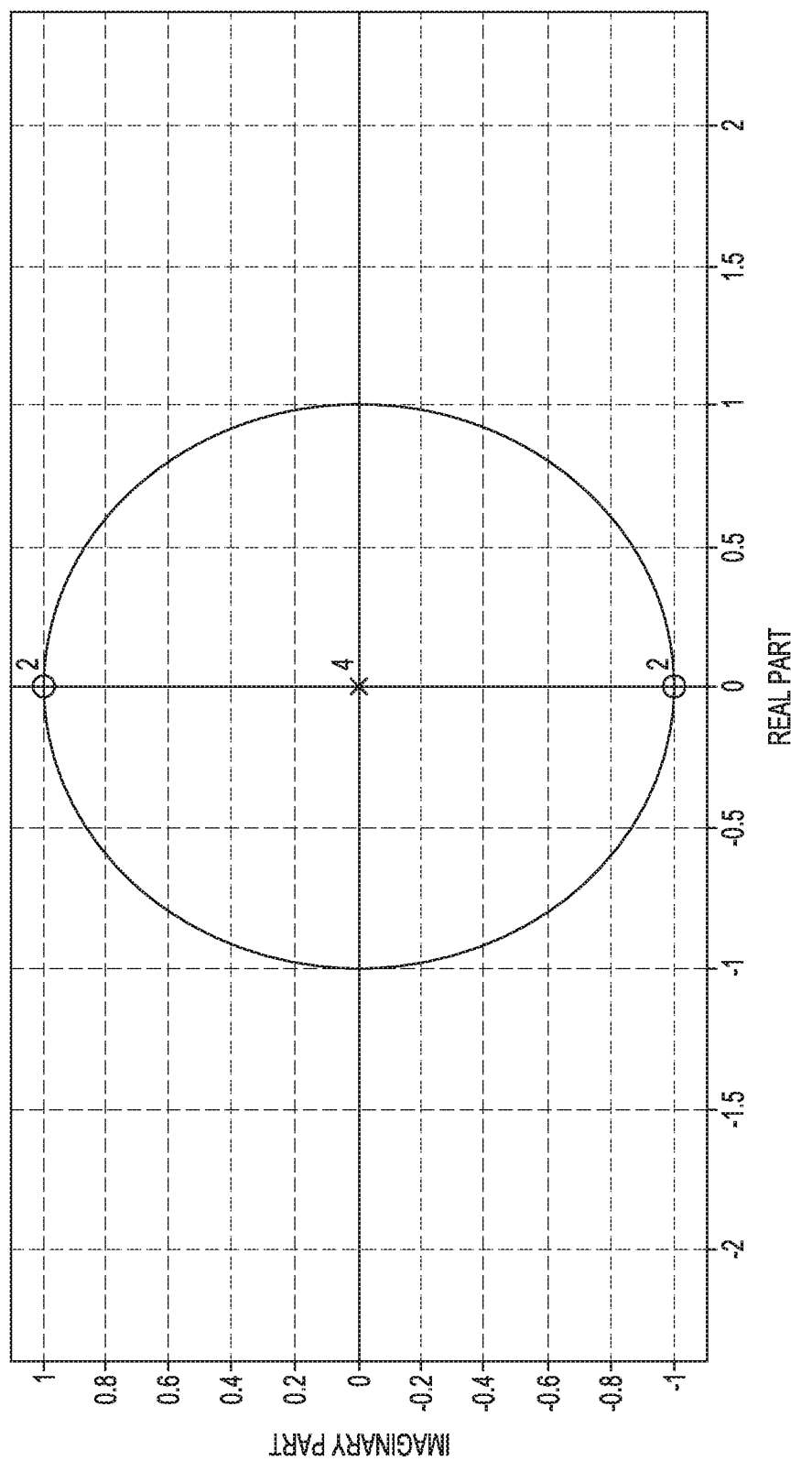
FIG. 2B illustrates the poles and zeros associated with a noise transfer function.
Figure 2C:
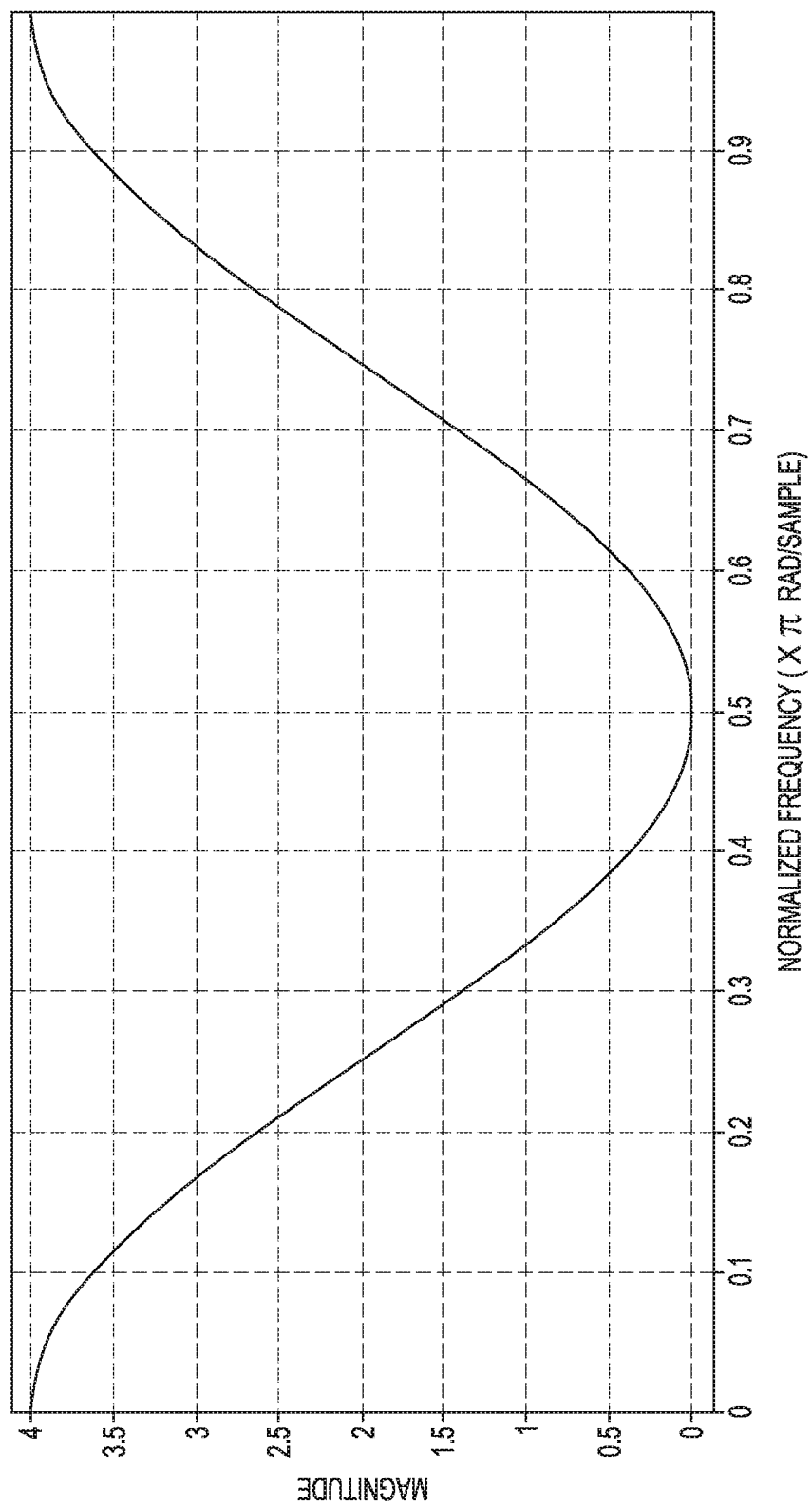
FIG. 2C illustrates the magnitude response associated with the noise transfer function.

FIGS. 2B and 2C show a mathematical representation of the noise transfer function (NTF) corresponding to a $4^{th}$ order bandpass filter, such as the $4^{th}$ order bandpass filter described in the above example referring to FIG. 2A. The signal transfer function (STF) can be 1. The transfer function of the bandpass filter (BPF) can be described by the following expression:

$$-2z^{-1}-z^{-3}$$

The noise transfer function can be represented by the following expression:

$$1+2z^{-2}+z^{-4}$$

FIG. 2B shows the poles and zeros associated with the noise transfer function. In the example, the noise transfer function can have a fourth order pole at z=0 and second order zeros at z=±i. FIG. 2C shows the response associated with the noise transfer function.

Figure 3:
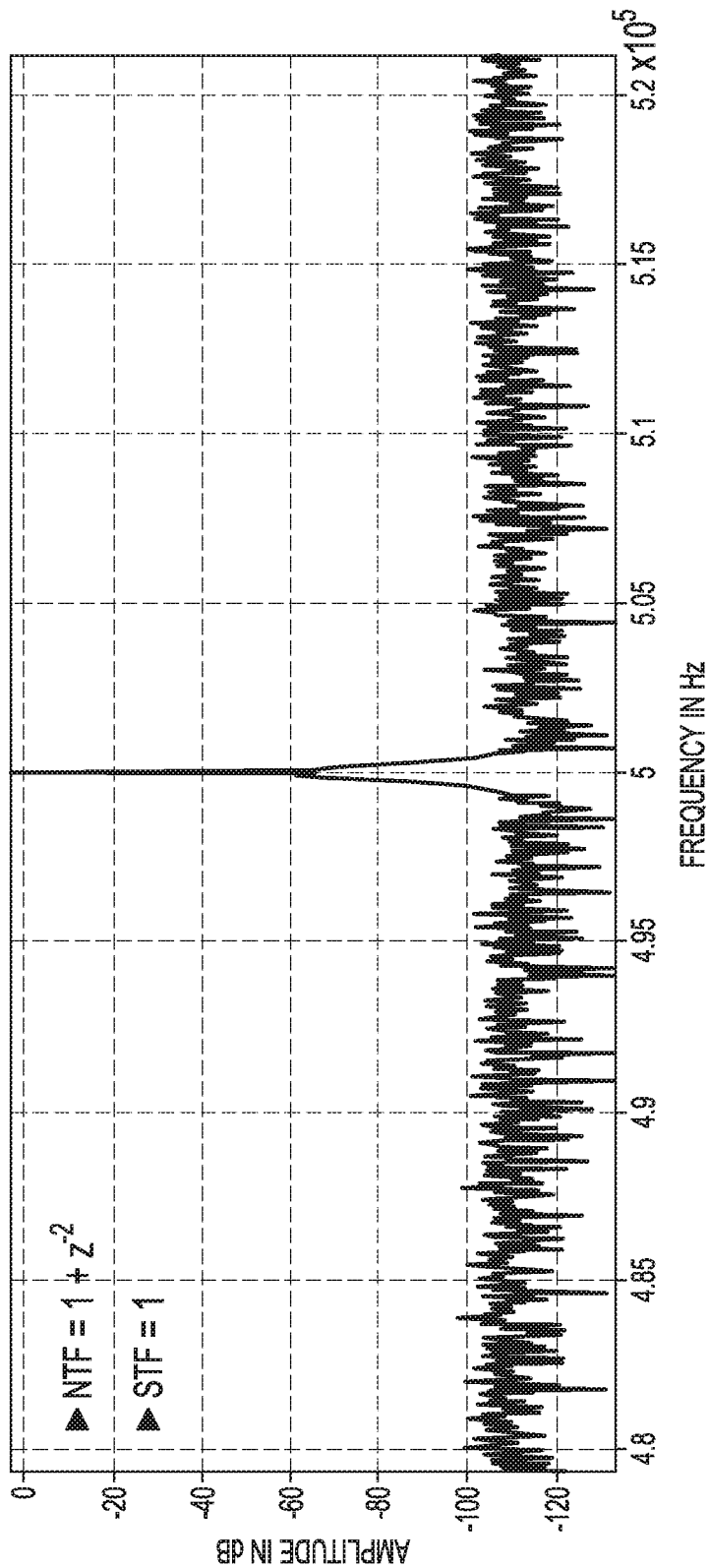
FIG. 3 illustrates an example of the output in a bandpass shaped SAR ADC.

FIG. 3 shows a simulated example of a noise transfer function in a bandpass shaped SAR ADC, such as the SAR ADC and bandpass shaping circuitry 100. In the example shown in FIG. 3A, the noise shaped SAR ADC can include 8 bits of quantization (e.g., the DAC 105 can represent 8 digital bits), and the array of capacitors 106 can have a total capacitance of 1.5 pF. The bandpass filter can be a $2^{nd}$ order passive filter. The noise transfer function can have a center frequency of 500 kHz and a bandwidth of 10 kHz. In the example, the noise transfer function can be $1+z^{-2}$. In an example, the bandpass filter can be implemented with capacitors and switches. The DAC 105 can sample an analog input signal at a rate of 2 MHz and the OSR (oversampling rate) can be 100. In the example, the signal-to-noise ration of the noise shaped SAR ADC can be 91.55 dB.

Figure 4:
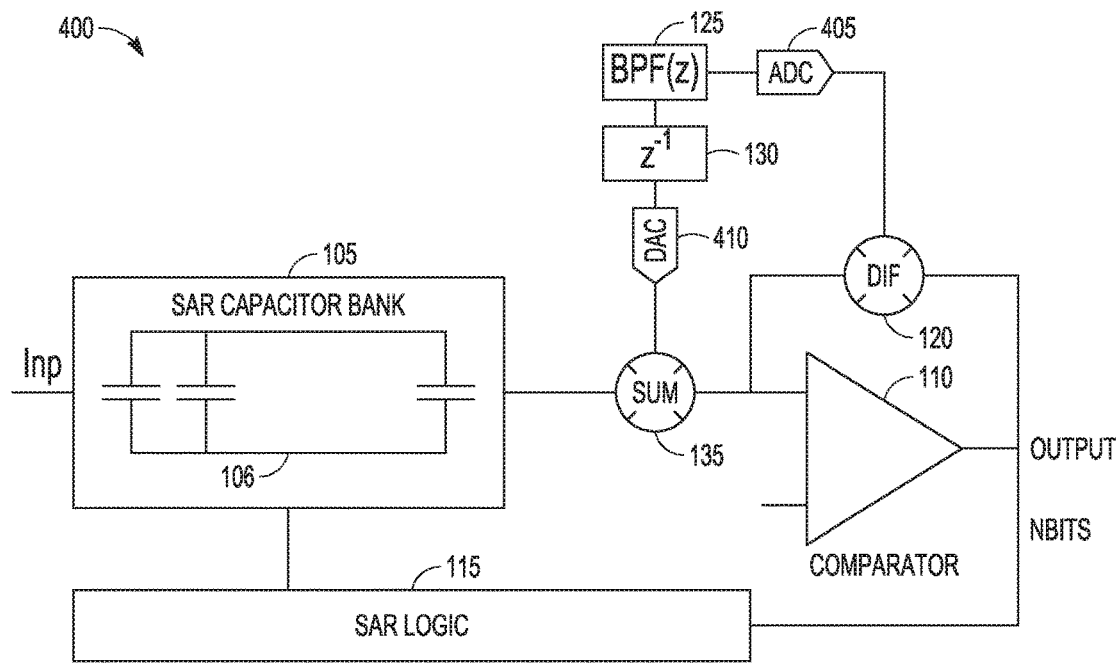
FIG. 4 illustrates a diagram of a SAR ADC and bandpass shaping circuitry.

FIG. 4 shows an example of a SAR ADC and bandpass shaping circuitry 100. The SAR ADC and bandpass shaping circuitry can include a digital-to-analog converter (DAC) 105, a summation circuit 135, a comparator 110, SAR logic circuitry 115, a summation circuit 120, a digital bandpass filter 125, a delay line 130, analog-to-digital converter (ADC) 405. In an example, the DAC 105 can include an array of capacitors 106. The DAC 105 can be connected to the summation circuit 135 and to the SAR logic 115. The summation circuit 135 can be connected to the comparator 110 and to the DAC 410. The comparator 110 can be connected to the summation circuit 120 and to the SAR logic 115. The summation circuit 120 can be connected to the ADC 405. The ADC 405 can be connected to the digital bandpass filter 125. The digital bandpass filter 125 can be connected to the delay line 130. The delay line 130 can be connected to the DAC 410. During operation, an analog input signal can be sampled at an input of the DAC 105. The SAR logic circuitry 115 can control the operation of the DAC 105 and in cooperation with the comparator 110 can provide an N-bit digital estimation of the analog input signal having N-bits. The digital estimation can be provided such as by comparing the sampled analog input signal to reference voltages provided by the DAC 105 in series of N bit trials. The comparator 110 can make a comparison during each of the N bit trials such as to provide results of the comparisons to the SAR logic circuitry 115. After conversion of the sampled analog input signal to an N-bit digital value, a residual error of the DAC 105 can represent a difference between the sampled analog input signal and the N-bit digital estimate. In an example the DAC 105 can be a capacitor DAC (CDAC) and the residual error can be present at the plates of the array of capacitors 106. The residual error present at the plates of the array of capacitors 106 can be provided to the summation circuit 120 and the summation circuit 120 can provide a difference between the residual error and an output of the comparator 110 to the ADC 405. The ADC 405 can convert the residual error to a digital value and then provide the digital value to an input of the digital bandpass filter 125. The digital bandpass filter 125 can provide a bandpass filtered output to a delay line 130. The delay line 130 can introduce a delay and then provide the bandpass filtered output to a DAC 410. The DAC 410 can convert the bandpass filtered output to an analog value and then provide the converted bandpass filtered output to a summation circuit 135, such as which can provide the converted bandpass filtered output to an input of the comparator 110 during the next N-bit digital conversion.

Figure 5:
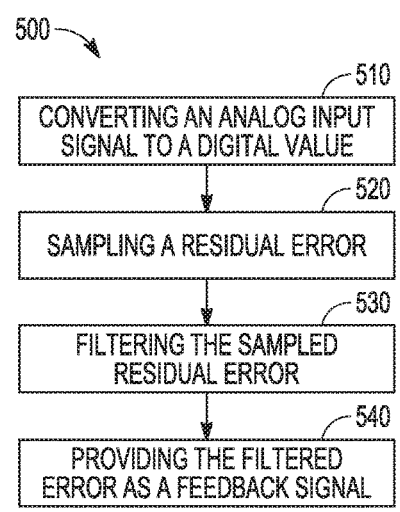
FIG. 5 illustrates a method of operation of a SAR ADC and bandpass shaping circuitry.

FIG. 5 illustrates a method of operating a method of operation of a SAR ADC and bandpass shaping circuitry, such as SAR ADC and bandpass shaping circuitry 100. The SAR logic circuitry 115 can control the operation of the DAC 105 and in cooperation with the comparator 110 can convert an analog input signal to a digital value (step 510). After conversion of the sampled analog input signal to a digital value, a residual error of the DAC 105 can be sampled and provided to the bandpass filter 125 (step 520). The sampled residual error can then be filtered by the bandpass filter 125 (step 530). The bandpass filter 125 can then provide the filtered, sampled residual error to an input of the DAC 105 as a feedback signal.

The invention claimed is:

1. A method of bandpass shaping the noise of a sequential approximation register (SAR) analog-to-digital converter (ADC) circuit having a comparator, a digital-to-analog converter (DAC) circuit, and logic circuitry, the method comprising:

sampling an analog input signal by the DAC circuit and carrying out at least one bit trial of the DAC in cooperation with the comparator and logic circuitry to convert the sampled analog input signal into a digital signal and thereby leave the DAC in a bit-trialed state;

sampling a residual error of the DAC while in the bit-trialed state;

filtering the sampled residual error with a bandpass filter; and providing the output signal of the bandpass filter as a feedback signal.

2. The method of claim 1 comprising adding the output signal of the bandpass filter as a feedback signal to the DAC.

3. The method of claim 1 comprising subtracting the output signal of the bandpass filter from a reference voltage provided by the DAC.

4. The method of claim 1 wherein the bandpass filter is a passive filter configured to sample the residual error of the DAC while in the bit-trialed state.

5. The method of claim 4 wherein the bandpass filter is a switched capacitor filter configured to store charge on at least one capacitive element during bit trial cycles of the DAC circuit and transfer charge to or from the at least one capacitive element while the DAC is in the bit-trialed state.

6. The method of claim 5 comprising transferring a charge corresponding to the output signal onto a capacitive storage element while the DAC is in the bit-trialed state.

7. The method of claim 6 comprising connecting a terminal of the capacitive storage element to the DAC or reference during bit trials of the DAC.

8. The method of claim 1 wherein sampling the residual error of the DAC while in a bit-trialed state includes sampling the residual error during one bit trial cycle of the DAC circuit.

9. The method of claim 1 comprising:
converting the sampled residual error to a digital signal;
filtering the digital signal with a digital bandpass filter;
converting the filtered digital signal to an analog signal; and
providing the analog signal as a feedback signal.

10. The method of claim 1 comprising delaying the providing of the output signal of the bandpass filter as a feedback signal by one or more clock cycles of the SAR ADC.

11. An oversampled sequential approximation register (SAR) analog-to-digital converter (ADC) circuit comprising:
a digital-to-analog converter (DAC) circuit configured to sample an analog input signal and carry out at least one bit trial in cooperation with a comparator and logic circuitry to convert the sampled analog input signal into a digital signal and thereby leave the DAC in a bit-trialed state; and
a bandpass filter configured to sample a residual error of the DAC while in the bit-trialed state and provide a filtered output signal as a feedback signal to the comparator.

12. The oversampled SAR ADC circuit of claim 11 wherein the bandpass filter is configured to add the output signal as a feedback signal to the DAC or subtract the output signal of the bandpass filter from a reference voltage of the SAR ADC circuit.

13. The oversampled SAR ADC circuit of claim 11 wherein the bandpass filter order or coefficients are programmable.

14. The oversampled SAR ADC circuit of claim 11 wherein the bandpass filter is a passive filter configured to sample the residual error of the DAC while in the bit-trialed state.

15. The oversampled SAR ADC circuit of claim 11 wherein the bandpass filter is a switched capacitor filter configured to store charge on capacitive elements during bit trial cycles of the DAC circuit and transfer charge to or from the capacitive elements while the DAC is in the bit-trialed state.

16. The oversampled SAR ADC circuit of claim 11 comprising a capacitive storage element configured to receive and store a charge corresponding to the filtered output signal while the DAC is in the bit-trialed state.

17. The oversampled SAR ADC circuit of claim 11 wherein the capacitive storage element is configured to provide a voltage corresponding to the stored charge to the DAC during bit trials of the DAC.

18. The oversampled SAR ADC circuit of claim 11 wherein the bandpass filter is configured to sample the residual error during one bit trial cycle of the DAC circuit.

19. The oversampled SAR ADC circuit of claim 11 comprising:
an ADC circuit configured to convert the sampled residual error to a digital signal;
a bandpass filter configured to filter the digital signal; and
a digital-to-analog converter (DAC) configured to convert the filtered digital signal to an analog signal and provide the analog signal as a feedback signal.

20. An oversampled sequential approximation register (SAR) analog-to-digital converter (ADC) circuit comprising:
means for sampling an analog input signal and carrying out at least one bit trial in cooperation with a comparator and logic circuitry to convert the sampled analog input signal into a digital signal and thereby leave the sampling means in a bit-trialed state;
means for sampling a residual error while the sampling means is in the bit-trialed state;
means for filtering the sampled residual error; and
means for providing the output signal of the filtering means as a feedback signal.

* * * * *